United States Patent [19]

Ganssen et al.

[11] 4,390,840
[45] Jun. 28, 1983

[54] ZEUGMATOGRAPHY PROCESS

[75] Inventors: Alexander Ganssen; Arnulf Oppelt, both of Erlangen; Wilfried Loeffler, Herzogenaurach, all of Fed. Rep. of Germany

[73] Assignee: Siemens Aktiengesellschaft, Berlin & Munich, Fed. Rep. of Germany

[21] Appl. No.: 208,145

[22] Filed: Nov. 19, 1980

[30] Foreign Application Priority Data

Dec. 20, 1979 [DE] Fed. Rep. of Germany ....... 2951537

[51] Int. Cl.$^3$ ............................................. G01R 33/08
[52] U.S. Cl. .................................... 324/309; 324/318
[58] Field of Search ............... 324/300, 307, 309, 311, 324/312

[56] References Cited

U.S. PATENT DOCUMENTS

| 4,070,611 | 1/1978 | Ernst ...................................... 324/309 |
| 4,290,019 | 9/1981 | Hutchinson ........................... 324/309 |
| 4,307,343 | 12/1981 | Likes ..................................... 324/309 |

OTHER PUBLICATIONS

E. P. Day, "Detection of NMR Using a Josephson—Junction Magnetometer," *Physical Review Letters*, vol. 29, No. 9, (1972) pp. 540–542.

R. A. Webb, "New Technique for Improved Low Temperature SQUID NMR Measurements", *Rev. Sci. Instrum.*, vol. 48, No. 12, Dec. 1977, pp. 1585–1594.

P. Lauterbur, "Image Formation by Induced Local Interactions: Examples Employing Nuclear Magnetic Resonance", *Nature*, vol. 242, Mar. 1973, pp. 190–191.

P. Mansfield and I. L. Pykett, "Biological and Medical Imaging by NMR", *Journal of Magnetic Resonance*, vol. 29, (1978), pp. 355–373.

R. Damadian et al., "Field Focusing Nuclear Magnetic Resonance (FONAR): Visualization of a Tumor in a Live Animal", *Science*, vol. 194, Dec. 1976, pp. 1430–1432.

W. S. Hinshaw, "Spin Mapping: The Application of Moving Gradients to NMR", *Physics Letters*, vol. 48A, No. 2, Jun. 1974, pp. 87–88.

A. Kumar et al., "NMR Fourier Zeugmatography", *Journal of Magnetic Resonance*, vol. 18, (1975), pp. 69–83.

Z. Abe et al., "Non-invasive Measurements of Biological Information with Application of Nuclear Magnetic Resonance", C. Thomas Publ., Springfield, IL, (1974).

P. A. Bottomley and E. R. Andrew, "RF Magnetic Field Penetration, Phase Shift and Power Dissipation in Biological Tissue: Implications for NMR Imaging", *Phys. Med. Biol.*, vol. 23, No. 4, (1978), pp. 630–643.

D. I. Hoult and P. Lauterbur, "The Sensitivity of the Zeugmatographic Experiment Involving Human Samples", *Journal of Magnetic Resonance*, vol. 34, (1979), pp. 425–433.

D. I. Hoult, R. E. Richards, "V.H.F. F.E.T. Preamplifier With 0.3 dB Noise Figure", *Electronic Letters*, vol. 11, No. 24, Nov. 1975, pp. 596–597.

D. I. Hoult, "Rotating Frame Zeugmatography", *Journal of Magnetic Resonance*, vol. 33, (1979), pp. 183–197.

G. Schwierz et al., "Principles of Image Reconstruction in X-ray Computer Tomography", *Siemens Forsch. u. Entwickl.-Ber.*, vol. 7, No. 4 (1978), pp. 196–203.

*Primary Examiner*—Michael J. Tokar
*Attorney, Agent, or Firm*—Hill, Van Santen, Steadman, Chiara & Simpson

[57] ABSTRACT

In the exemplary embodiments, the imaging of the interior of bodies is rendered possible by means of nuclear magnetic resonance. Up to the present time, the known methods have such a small signal-to-noise ratio that the medical application is uncertain on account of the necessary long measuring duration and the thus unavoidable body movement. The disclosed method permits a significant raising of the signal-to-noise ratio and thus renders possible a shortening of the measuring time for the purpose of preparing medically utilizable images. For this purpose, the disclosure provides, through inversion of the nuclear magnetization by means of "fast adiabatic passage" in the primary field direction and simultaneous detection of the magnetization change by a longitudinal field detector, the attainment of a spatially resolved examination of extensive objects by means of nuclear magnetic resonance (NMR, entire body-zeugmatography) with substantially higher constant field intensities than previously. The signal-to-noise ratio can thereby be increased in the manner desired, and the measuring time can be shortened. The disclosed zeugmatography method is therefore also suitable for medical examinations.

2 Claims, 8 Drawing Figures

ZEUGMATOGRAPHY PROCESS

BACKGROUND OF THE INVENTION

The invention relates to a zeugmatography process according to the preamble of patent claim 1. Such methods for the imaging of the interior of bodies utilizing the phenomenon of nuclear magnetic resonance (NMR) have become known under the designation of zeugmatography, spin-imaging, spin-mapping, or FONAR. However, the known methods have a very small signal-to-noise ratio, so that, on account of the long measuring duration therefore resulting, the medical apparatus is uncertain.

Methods for imaging of the nuclear spin density of specific isotopes (most frequency hydrogen) in the interior of bodies, specifically, medically significant distributions in the interior of the human body, have been described, e.g. by P. Lauterbur (1973), P. Mansfield and I. L. Pykett (1978), R. Damadian et al (1976), W. S. Hinshaw (1974), as well as A. Kumar et al (1975), and Z. Abe et al (1974). (Complete citation of these references is found at the end of the Detailed Description, under the heading "Literature References".) These methods can also be employed in order to obtain information regarding physical and chemical conditions and their change in the interior of bodies, such as e.g. chemical composition and metabolism, as well as through-flow rate and speed of flow. Use is here made of the phenomenon of nuclear magnetic resonance. The body to be examined is exposed for this purpose to a constant (D.C.) magnetic field $B_o$ and the nuclear isotopes to be detected are excited to precession by a high frequency field $B_1$ of the angular frequency $$\omega_o = \gamma B_o$$

where $\gamma$ is the gyromagnetic ratio of the corresponding nuclei. Customarily, the transverse component of the precessing magnetization is then detected by means of induction.

The detected signal is proportional to the precessing magnetization $M_o$ which, in turn, is proportional to the primary magnetic field $B_o$ and to the precession frequency $\omega_o$.

Thus, for a good signal-to-noise ratio, as high as possible a constant field $B_o$ and hence also as high as possible a measuring frequency is desired. Conflicting with this is the finite conductivity of the body to be examined; i.e., for medical application, that of a biological body. On account of the known skin-effect, namely, the high frequency field, exciting the nuclear resonance, varies over the cross section of the measurement object. It is thus no longer guaranteed that the precession angle for the excited nuclear spin is approximately constant over the body cross section. Moreover, the signal contributions from the marginal zones and the interior zones of the body to be examined are detected with varying intensity. In an assessment of Bottomley and Andrew (1978), it is shown that imaging-nuclear magnetic resonance processes for medical diagnostic total body imaging at frequencies above 10 MHz (in the case of protons corresponding to constant fields greater than 0.25 T) are seriously impaired by the skin effect. However, according to Hoult and Lauterbur (1979), it can be predicted therefrom that, in the case of the permissible measurement frequencies, images having satisfactory signal-to-noise ratios necessitate exposure times which lie in the range of minutes; however, particularly for applications in medical diagnostics, shorter exposure times would be desirable on account of unavoidable body movements.

SUMMARY OF THE INVENTION

The invention has presented itself with the object, in the case of a method according to the preamble of claim 1, of achieving a substantial increase in the signal-to-noise ratio, so that also the measurement time required for preparation of medically relevant images can be shortened. In accordance with the invention, this object is achieved by the measures disclosed in the characterizing clause of claim 1. Expedient embodiments of the invention are subjects of the subclaims.

Through the application of "adiabatic fast passage" for the purpose of inversion of the nuclear magnetization in the primary field direction $B_o$ and the simultaneous determination of this magnetization change by a longitudinal field detector (induction coil or Josephson-detector, Squid), a spatial imaging of the nuclear magnetic resonance (NMR) of extensive objects (total body zeugmatography) becomes possible even in the case of substantially higher constant field intensities than hitherto. The signal-to-noise ratio can thereby be increased and the measurement time can be shortened, so that the use of the method for medical diagnostics is improved. As an individual experiment in the case of a non-spatially resolving magnetic nuclear resonance experiment on water and lithium fluoride, E. P. Day (1972), reports of the detection of fast adiabatic resonance passage with a detector which responds to the longitudinal component of the nuclear magnetization and functions with a Josephson-junction magnetometer (Squid).

In this detection method, the signal amplitude is proportional to double the nuclear equilibrium magnetization and is, within broad boundaries, independent of the radio frequency power. Only the condition $$|\gamma B_1|^2 >> \frac{d\omega}{dt} >> \gamma \frac{\Delta B}{T_1}$$

must be satisfied, whereby $B_1$ signifies the radio frequency amplitude; $T_1$, the longitudinal spin relaxation time of the nuclear spin system; $\Delta B$ signifies the inhomogeneity of the primary field, and $d\omega/dt$ signifies the speed with which the frequency of the radio frequency field is altered.

At issue is the fact that a locally resolving detection of the nuclear magnetization $M_o$ in extensive objects is to be conducted in that the nuclear magnetization is successively inverted at different locations by means of adiabatic fast passage.

The local excitation proceeds, as in the case of the methods which are known from zeugmatography, through application of gradient fields ($dB_o/dr$, whereby r stands for a position vector—generally perpendicular to the primary field).

The locally effected inversion of the nuclear magnetization from $+M_o \rightarrow -M_o$ would be best measured with a Josephson-junction magnetometer (Squid). In the case of a correspondingly rapid sequence of the resonance passages, an induction coil can also be employed as detector. However, it is less effective as compared with a Squid because the induced signal occurs with a relatively small frequency and therefore must be additionally amplified. (The term "Squid" is an acronym referring to superconducting quantum interference device.)

Low frequency amplifiers, in addition, exhibit a relatively great inherent noise. Since, for the constant field intensities $B_o$ of approximately 1 to 10 Tesla, entering into consideration, superconductive field coils should advantageously be employed on account of the otherwise great power dissipation, the application of the superconductive Squid detector is particularly advisable on account of the low inherent noise.

For a two-dimensional instance, the manner of procedure for providing an image of the nuclear spin density would look approximately as follows:

With superconductive magnetizing coils with room temperature access, a constant (D.C.) field $B_o$ is generated in the body to be represented with NMR.

Superimposed on this constant field $B_o$, transversely to the direction of said field $B_o$, is a linear field gradient $G = dB_o/dr$, which can be rotated in step-wise fashion through an angle $\phi$ of at least 180° about the field direction $B_o$.

For each angular step the excitation frequency is varied over the entire nuclear resonance spectrum, resulting from the field intensity distribution over the body section to be represented, and the change in the longitudinal magnetization is recorded in a time-synchronous fashion. In this manner, with every gradient adjustment, one obtains a projection of the nuclear spin density (or a combination of line integrals regarding the nuclear spin density, respectively). From the totality of these projections an image of the spin density can be reconstructed with the method which is known from computer tomography (CT) (a corresponding description is to be found e.g. in the case of Schwierz et al (1978)).

Instead of varying a frequency over the entire nuclear resonance spectrum, it is also possible to vary several excitation frequencies, uniformly distributed over the spectrum, over the partial spectra. In order to distinguish the transition signals from different spectral ranges (magnetic field intervals), the different excitation frequencies must be subjected to different modulation frequencies (frequency modulation). Resulting, in particular, as an advantage of this multiple frequency modulation is that, during excitation with n different frequencies, at the same time, one receives n-times the signal amplitudes and hence obtains a signal-to-noise improvement by the factor $\sqrt{n}$.

Further advantages and details of the invention shall be explained in greater detail in the following on the basis of the exemplary embodiments illustrated in the Figures of the accompanying drawing sheets; and other objects, features and advantages will be apparent from this detailed disclosure and from the appended claims.

DETAILED DESCRIPTION

Figure 1:
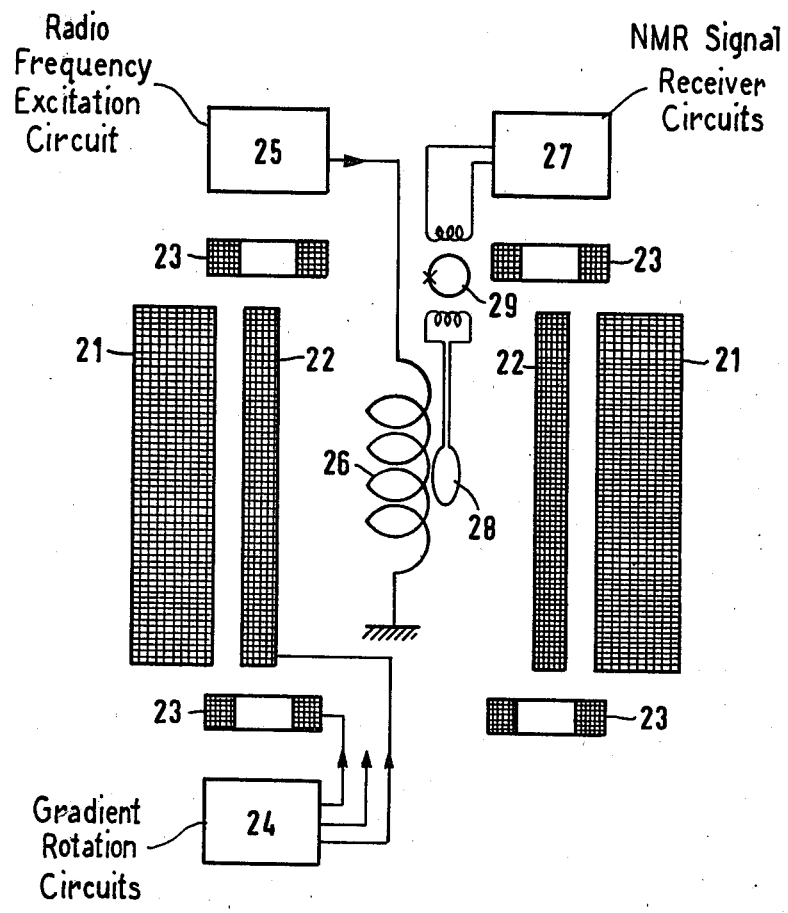
In FIG. 1 there is illustrated, in a block circuit diagram, an apparatus for excitation of rapid, adiabatic resonance passages and simultaneous reception of the nuclear longitudinal magnetization, as well as for further processing these signals with the object of achieving a local resolution.

In FIG. 1, reference numerals 21, 21 designate the field (or magnetizing) coils of a magnet in Helmholtz-arrangement which generates the required homogeneous primary field in the sample to be examined. Reference numerals 22 and 23 designate gradient coils for generating independent, mutually perpendicular magnetic field gradients $G_y$ and $G_z$. An additional gradient coil set generates a field gradient $G_x$ perpendicularly to that which is effected by 22 and 23 and is not shown in the illustration for reasons of clarity.

In a housing 24 an electronic system, known per se, is disposed for the purpose of current supply and successive rotation of the field gradients G. Reference numeral 25 designates an electronic system for the purpose of generating and modulating radio frequency excitation current. The latter is supplied to the transmitting coil 26 which generates the radio frequency field necessary for excitation of the rapid-adiabatic resonance passage of the nuclear spin. The latter field is disposed perpendicularly to the primary field. Component 28 is a pickup coil which detects variations in the magnetization parallel to the primary field. This coil can be superconductive and connected with a Squid detector 29. In the housing 27 there is then disposed the electronic system for reception of the Squid signal. The helium bath for cooling the superconductive detection coil 28 and the Squid 29 is not illustrated for reasons of clarity. Component 28 can, however, also be a normal induction coil (superconductive or normally conductive), whose signal is further processed in a conventional electronic amplifier; the latter is not illustrated for reasons of clarity. From the output of receiver component 27 a signal is then available which, following further processing in the computer, can be employed for imaging of the spin density.

Figures 2, 3, 4:
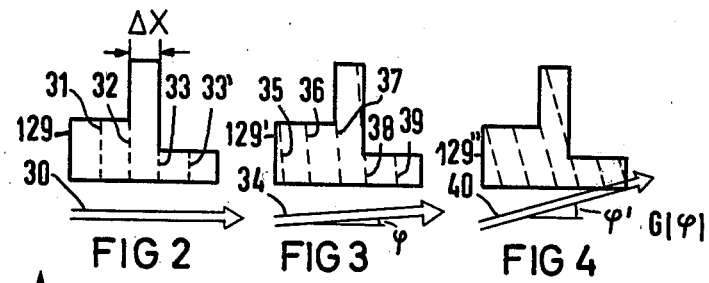
In FIGS. 2 through 4 the pickup of projections on a sample body is illustrated.

In FIG. 2, 129 designates a body to be examined which is coplanar relative to the image plane; in the body 129 a primary field $B_o$ is generated perpendicularly to the image plane, there being superimposed on said basic field $B_o$ a field gradient in the direction of an arrow 30 and which, as indicated by dash lines 31 through 33, 33', is to be successively scanned perpendicularly to the field gradient. The spin density is to be constant over the range $\Delta x$.

In FIG. 3, according to the indication by an arrow 34, the superimposed field gradient is rotated through an angle $\phi$. The scanning indicated by dash lines 35 through 39 is then likewise inclined with respect to the dash lines 31 to 33, in the direction of the rotation of the arrow 34 as compared with the arrow 30.

In FIG. 4, as indicated by an arrow 40, the angle $\phi'$, through which the field gradient G is rotated, is greater than in FIG. 3.

Figure 5:
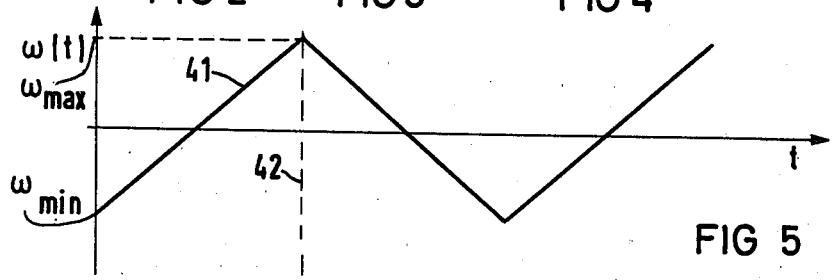
In FIG. 5 the plotting of the angular frequency variation in the course of the measuring time is illustrated.

In FIG. 5, in a diagram, the passage of the frequencies of the excitation high frequency from the minimum frequency $\omega_{min}$ to $\omega_{max}$ relative to time (plotted on the abscissa) is schematically illustrated. The frequency deviation $\omega_{max}$ minus $\omega_{min}$ is here given by the equation $$\omega_{max} - \omega_{min} \gtrsim \gamma G \cdot D,$$

whereby D signifies the diameter of the measurement subject, and G signifies the intensity of the field gradient. The mean frequency is given by the primary field corresponding to $$\omega_o = \gamma B_o$$

The line 41, resulting in the diagram, shows an increase from the minimum frequency up to the maximum frequency which terminates at the broken line 42. Upon return, the line 41 is bent and, with respect to the ordinate, again runs downwardly in the same angle in which it previously rose, etc.

Figure 6:
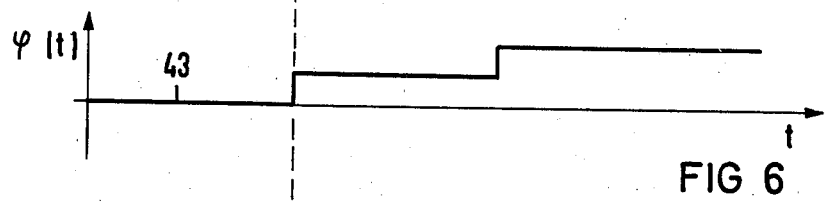
In FIG. 6 the variation of the angle $\phi$ in the course of the measuring time is illustrated.

In FIG. 6, the angle $\phi$ is plotted in the direction of the ordinate, and on the same time scale as in FIG. 5 (line 42 representing the same instant of time in each of FIGS. 5-8). The value $\phi$ represents the instantaneous angular position of the field gradient, which as indicated by the arrows 30, 34 and 40, is rotated as a function of the time. The line 43 here indicates the magnitude of $\phi$ in the course of the measurement time.

Figure 7:
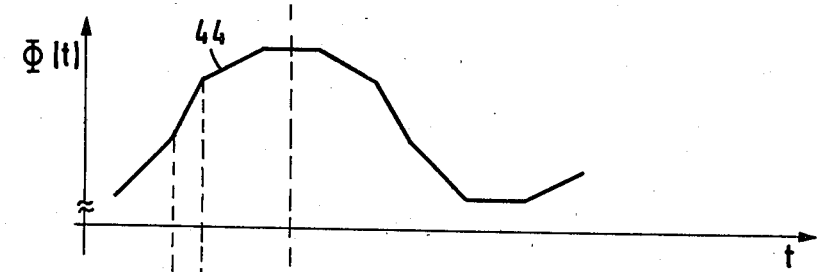
In FIG. 7 the variation of the flux as a function of measuring time is illustrated; and In FIG. 8 the variation of the flux per unit of time over the measuring time is illustrated.
Figure 8:
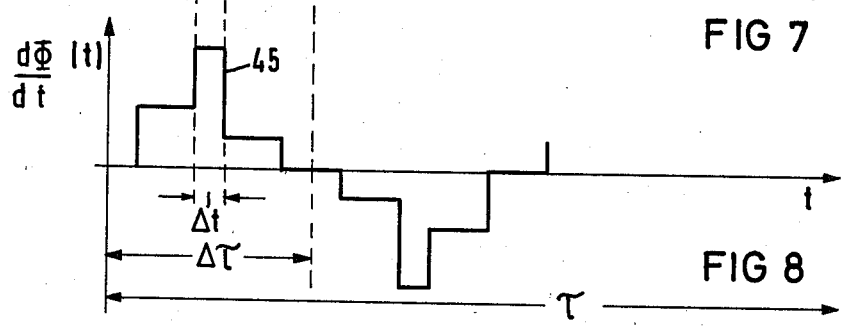

In FIG. 7, the flux $\phi$, as it is received by the longitudinal field detector of the nuclear resonance apparatus, is plotted in the ordinate relative to the time in the abscissa, whereby the plotting diagram likewise corresponds to that of FIG. 5. A line 44 results, which, up to the point of reaching the broken line 42; i.e., up to the reversal of the rise of the frequency, shows a rise which levels off in the direction of attainment of the maximum, which then exhibits a drop becoming increasingly steeper, and correspondingly rises again with the repeated rise in the frequency.

The plotting of and derivative of the flux with respect to time d $\phi$/dt as a function of time t yields, corresponding to the line 45, a projection of the body 129 onto the direction of the field gradient. The derivative is here positive in one scanning; i.e., during the period $\Delta \tau$, with regard to the diagram; i.e., during the rise of the frequency in FIG. 5. During the subsequent drop of the frequency in FIG. 5, (beyond line 42), the image is negative. Curve 45 corresponds to the voltage signal which is induced in an induction coil (in FIG. 1: component 28 without Squid detector).

As stated, an apparatus for the purpose of a locally-resolving nuclear resonance which, in accordance with the invention, instead of, as customarily, inverting the precessing transverse magnetization, inverts the nuclear magnetization by means of the fast adiabatic resonance passage and detects the quasi-static longitudinal magnetization, offers advantages with regard to the signal-to-noise ratio. Therefore, in the following, the signal-to-noise ratio for both methods is to be assessed and a comparison is to be conducted as well of the measurement time required for providing a complete image.

In the recording of the signals according to a fast adiabatic resonance passage, the effective magnetic field $B_{eff}$ in the rotating coordinate system $$B_{eff} = \sqrt{(B_o - \omega/\gamma)^2 + B_1^2}$$

$B_o$ = Basic (or primary) field
$B_1$ = Radio frequency field with the angular frequency $\omega$
$\gamma$ = Gyromagnetic ratio of the nuclei to be imaged is rotated form the direction parallel to the basis (or primary) field, to a direction anti-parallel to the basic (or primary) field, and the nuclear magnetization is thereby inverted. This can occur either through alteration of the basic (or primary) field ($B_o$) or through alteration of the frequency ($\omega$) of the $B_1$-field. In every case, it is a condition that the resonance passage proceed so slowly that the magnetization M can follow the effective field.

$$d\omega/dt = \gamma \, dB_o/dt \gg |\gamma B_1|^2 \quad \text{(Equation 2)}$$

and that it proceed so rapidly that no relaxation occurs during the resonance passage $$d\omega/dt = \gamma \, dB_o/dt \ll \Delta\omega/T_1 = \gamma\Delta B_o/T_1 \quad \text{(Equation 3)}$$
($\Delta\omega = \gamma\Delta B_o$: inhomogenous line width)
($T_1$ = longitudinal relaxation time).

FIGS. 2 through 8 show how a zeugmatography experiment can proceed: a linear gradient (G) is superimposed on the basic (or primary) field $B_o$; a fast resonance passage is made, whereby either the longitudinal magnetization is picked up by means of a Squid, or the change in the longitudinal magnetization is picked up by means of an induction coil as a function of the time (i.e., of $B_o$ or $\omega$); subsequently the gradient G is rotated through an angle $\phi$, the Z-magnetization ($M_z$) is flipped back (or inverted) by means of a rapid resonance passage, the gradient is again rotated, etc. From a plurality of projections measured in this manner, an image of the sample magnetization can be reconstructed.

The longitudinal component ($M_z$) (relative to the overall magnetization) of the nuclear magnetization is given by $$M_z = \frac{\omega - \gamma B_o}{\sqrt{(\omega - \gamma B_o)^2 + (\gamma B_1)^2}} \, . \quad \text{(Equation 4)}$$

If the frequency $\omega$ of the rf field is altered with the time t in accordance with $$\omega = \alpha t, \quad \text{(Equation 5)}$$

$M_z$ can be observed as a function of the time, whereby, corresponding to Equation 2, it is a prerequisite (or condition) that $$\alpha \ll (\gamma B_1)^2, \quad \text{(Equation 2a)}$$

in order that the nuclear magnetization can follow the effective field. This inequality is satisfied according to R. A. Webb (1977) if $$3.5\alpha \lesssim (\gamma B_1)^2. \quad \text{(Equation 2b)}$$

The derivative $dM_z/dt$ as a function of the time represents a nuclear resonance line with the (full) half value width $$\Delta t_{\frac{1}{2}} = 1.532 \frac{\gamma B_1}{\alpha}, \quad \text{(Equation 6)}$$

which thus is dependent upon the rf field and the sweep speed. Taking into account the adiabatic condition (Equation 2), this becomes $$\Delta t_{\frac{1}{2}} \gtrsim 3/\sqrt{\alpha} \, . \quad \text{(Equation 6a)}$$

In order to still be able to separate two lines, the latter must be chronologically displaced by $\Delta t_{\frac{1}{2}}$; i.e., they must have a frequency separation of $$\Delta\omega_{\frac{1}{2}} = \alpha\Delta t_{\frac{1}{2}} \gtrsim 3\sqrt{\alpha} \,. \quad \text{(Equation 7)}$$

As is known, in the case of zeugmatography, one achieves a local resolution by associating different ranges of a spectrum with spatially separated elements of volume (pixels) via a field gradient.

In the case of recording of a projection with a number of measured values equal to N, the dimension D−N:d (d=pixel size) of the measured object corresponds to a frequency splitting $\Omega = \gamma GD$ (G=field gradient), for which the following must be valid (Equation 7)

$$\Omega = N\Delta\omega_{\frac{1}{2}} \gtrsim 3 N\sqrt{\alpha} \,. \quad \text{(Equation 7a)}$$

Thus, for the measurement time of a projection $t^1 = \Omega/\alpha$ there results $$t^1 \gtrsim \frac{9 N^2}{\gamma GD}, \quad \text{(Equation 8)}$$

so that, for a measurement object of D=50 cm, there follows $$\frac{t^1}{\sec} \gtrsim 67.3 \cdot 10^{-6} \frac{N^2}{G/\frac{mT}{m}} \,. \quad \text{(Equation 8a)}$$

In the case of a field gradient of one millitesla per meter ($1^{mT}/m$), conventional in zeugmatography, for a projection with one hundred measured values, one requires at least 0.7 sec; this corresponds to a sweep rate $\alpha = 200\cdot 10^3$ 1/sec$^2$ = 30 kHz/sec. From Equation (2a), a necessary radio frequency field results of $B_1 \geq 0.03$ gauss.

Zeugmatography with the adiabatic, fast resonance passage, with detection of the longitudinal magnetization, is proposed in order to be able, in spite of skin effect, to utilize the sensitivity advantage of high basic (or primary) fields. Bottomley and Andrew (1978) indicate that the radio frequency field intensity can vary over a biological subject of 40 cm diameter, given a frequency of 50 MHz, up to 33%. According to Equation (6) this signifies that the discrimination of two pixels in the region of the stronger rf field (i.e., at the border) is less, which must then be compensated by three times longer a measuring time than estimated above.

Thus, since the detection of the longitudinal magnetization will probably take place at a very low frequency (Equation 8a), it is possible, in order to avoid the low frequency noise of the electronic amplifier elements (shot effect) noise and excess (or flicker) noise, to employ, as the detection element, a Squid in conjunction with liquid helium-cooled detection coils. The magnetic (or induction) flux issuing from the sample is then detected $$\Phi = MB^1 \quad \text{(Equation 9)}$$

$B^1$ = geometry factor of the detection coil, field per unity current
M = magnetic moment of the sample
 = m$\omega$
m = magnetic moment per unit angular frequency.

This "useful signal" must be compared with the noise flux which is coupled from the measurement object into the detection coil. The significant noise source in the case of nuclear resonance on living subjects is the Brownian motion of the ions in the sample: Hoult and Lauterbur (1979) estimate for the equivalent noise resistance $R''_{äq}$ of the receiving coil:

$$R''_{äq} = r\cdot\omega^2 \quad \text{(Equation 10)}$$

(r=noise constant)
which, for the Squid, corresponds to a noise flux $\Phi_r$ of $$\Phi_r \simeq \sqrt{4 kTr\, \Delta f} \quad \text{(Equation 11)}$$

(f=dection band width=N/t$_1$)
(k=Boltzmann's constant)
(T=temperature).

As the signal-to-noise ratio $\epsilon_e$ during detection of the longitudinal magnetization (relative to a pixel), finally, there follows, during recording of a projection $$\epsilon_e = \sqrt{F_{sq}} \; \frac{m B^1}{N^{3/2}\sqrt{4 kTr}} \sqrt{t_1} \,. \quad \text{(Equation 12)}$$

The Squid-noise figure $F_{sq}$ results at $$F_{sq} = \frac{\text{noise power of coil and Squid}}{\text{noise power of coil alone}} \quad \text{(Equation 13)}$$

$$= \frac{4 kTr\, \Delta f + \Phi_r^2 \text{(Squid)}}{4 kTr\, \Delta f}$$

For the inherent noise of a Squid Equation (10) applies.

$$\Phi_r \simeq 10^{-4} \Phi_o \times \sqrt{\Delta f/\text{Hz}}, \; \Phi_o = 2.07 \times 10^{-15} \, V\text{sec}$$

and a typical value for the noise figure of an entire body coil is $(2\pi)^2 r = 1.875\cdot 10^{-15} \, \Omega/\text{Hz}^2$ (Hoult and Lauterbur (1979)); for the noise figure there then follows $F_{sq} = 1.05 = 0.23$ dB.

In comparison with the detection of the longitudinal magnetization, during detection of the transverse magnetization, after 90°-excitation, there follows for the signal-to-noise ratio $\epsilon_q$ during recording of a projection $$\epsilon_q = \sqrt{F} \; \frac{m B^1}{N\sqrt{4 kTr}} \sqrt{t_1} \quad \text{(Equation 14)}$$

(F=noise figure of the detection apparatus).
In the case of detection of the transverse magnetization, in the signal-to-noise ratio, given the same field and the same detection time, there is initially an improvement by the factor $\sqrt{N}$; also, one can reckon with noise figures $F \simeq 1$ (0.3 dB, see Houtl et al (1975)); however, one is restricted to frequencies below 10 MHz on account of the skin effect.

The factor $\sqrt{N}$, by which the longitudinal magnetization detection is even poorer than that of the transverse magnetization, is explained by the fact that, in the first instance, not all nuclei can be observed simultaneously (single channel detection) as in the latter instance (multichannel detection).

This disadvantage can be met in that, instead of sweeping a frequency entirely over the total band split up by the gradient, several individual frequencies with varying modulation rates are driven over individual partial ranges (or sub-ranges). Through discrimination of the nuclear resonance signal according to the corresponding sweep rates, the signal contributions can then be allocated to the individual partial (or sub-) ranges. If, in this manner, N measured values per projection are to be obtained, the sample must be excited with N frequencies in the spacing $\Delta\omega = \gamma G d$, whereby the time for driving-through (or passage) of the frequency interval $\Delta\omega$ cannot be permitted to be shorter than $\Delta t \geq 9/\Delta\omega$ (Equation 8). With the first excitation frequency one would then flip over (or invert) the first partial magnetization N-times (in the time N·$\Delta t$); with the second excitation frequency, (N−1) times the second partial magnetization, etc. The observed signal is composed of the sum of all partial magnetizations; a Fourier transform discriminates the individual components corresponding to the respective sweep times. In this manner, the signal-to-noise ratio is improved by the factor $\sqrt{N}$, however, the total measuring time remains the same as in the case of monochromatic excitation.

If one beams in only $n \leq N$ frequencies, zeugmatography with detection of the longitudinal magnetization and, conventionally, with detection of the transverse magnetization, differ in the signal-to-noise ratio by the factor $$\frac{\epsilon_e}{\epsilon_q} = \sqrt{\frac{n}{N}} \qquad \text{(Equation 15)}$$

N: number of measured values per projection
n: number of the simultaneously beamed-in frequencies.

However, during detection of the longitudinal magnetization, without impairment due to skin effect, one can proceed to high magnetic fields and hence improve the signal-to-noise ratio.

Hitherto, only the lower boundary for the measuring time of a projection was estimated due to the line width. An upper boundary is given by the condition that, during the adiabatic resonance passage of an element of volume, no relaxation can be permitted to take place (Equation 3); thus, the following must be valid for the measuring time per pixel $$(t^1/N) << T_1 \qquad \text{(Equation 16)}$$

N = number of measured values per projection
$T_1$ = longitudinal relaxation time (in the case of protons in biological material 0.1–1 sec).

In the case of monochromatic excitation, this condition can be readily satisfied in the case of a gradient of one millitesla per meter (1 mT/m) and 100 measured values per projection (0.7 sec/100 < <0.5 sec); however, in the case of full utilization of the advantages of multifrequency modulation, one must operate with 100 different drive-through (or sweep) times, whereby the slowest lasts precisely $t^1$ (0.7 sec). Thus, in order for Equation (16) to remain satisfied, one must decrease the measuring time by one order of magnitude and, on account of Equation (8), one must increase the gradient by one order of magnitude.

One could then record a projection in approximately 50 msec. However, for reconstruction of an image, a complete set of projections is required. If one measures a number of projections equal to L in immediate succession, then the magnetization M after the time L·$t_1$ has assumed the value $$M(L \cdot t_1) = \qquad \text{(Equation 17)}$$

$$M_o \left[ 1 - 2 \left( e^{-\frac{t_1}{T_1}} - e^{-\frac{2t_1}{T_1}} + e^{-\frac{3t_1}{T_1}} - + e^{-\frac{Lt_1}{T_1}} \right) \right]$$

This reduction in the magnetization naturally falsifies the spin densities reproduced in the image; therefore, it is not possible to record randomly many projections in immediate succession; on the contrary, it is necessary to wait occasionally until the nuclear spin system again attains thermal equilibrium.

In one assumes that, during utilization of the described multispectral excitation, the recording of two projections proceeds in immediate succession, then all spectral ranges are frequently inverted in even-numbered fashion. Thus, without taking into account the relaxation, the initial magnetization would be precisely adjusted again. Actually the magnetization according to Equation (17) amounts to only 82% of the initial value ($t_1$ = 50 msec, $T_1$ = 0.5 sec). It is therefore necessary, after two projections each, to wait a certain time $t_v$ in which the magnetization again approximates the thermal equilibrium. Should the magnetization attain the value $M_v$, one then obtains for this waiting period $$t_v = T_1 \ln \frac{1 - M(L \cdot t_1)M_o}{1 - M_v/M_o} \qquad \text{(Equation 18)}$$

If one assumes that the magnetization is again to attain 99% of the equilibrium value, a waiting time $t_v \approx 1.4$ sec must elapse. Thus, in approximately 75 sec, it is possible to record an image with 100 projections.

All considerations made previously related to the representation of a two-dimensional object. In order to select a layer of interest from a three-dimensional object, radiofrequency coils could be constructed which restrict their field to a narrow plane. It would also be possible, through continuous rf-beaming-in, to saturate all spins outside the plane of interest. This approach is proposed e.g. by Hoult (1979).

However, one can also restrict oneself to constructing projection images analogously to conventional x-ray photographs, which represent a shadow image and contain all measured quantities disposed in series in the direction of irradiation. Finally, however, one could also switch over to three-dimensional reconstruction by rotating the field gradient, not only about the axis of the basic (or primary) field, but also perpendicular thereto.

It will be apparent that many modifications and variations may be effected without departing from the scope of the novel concepts and teachings of the present invention.

We claim as our invention:

1. A method of producing an image representing nuclear spin density information for a body, using nuclear magnetic resonance signals, characterized in that, for the purpose of locally-resolved detection of such nuclear spin density information in said body, said method comprises (a) subjecting the body to a constant magnetic field $B_0$ along one axis,
(b) superimposing, transversely to said one axis, a linear field gradient $dB_0/dr$, which can be rotated in a stepwise fashion through at least 180 degrees about said one axis,
(c) varying the frequency of an exciting radio frequency field $B_1$ such that fast adiabatic resonance passages are excited in a region of the body to be examined,
(d) detecting the variation in magnetization alone said one axis synchronously with the frequency variation of the radio frequency field $B_1$ to derive a projection of the nuclear spin density perpendicularly to the superimposed field gradient,
(e) successively rotating the field gradient in a stepwise fashion about said one axis, and for each successive rotation of the field gradient, repeating the detecting step (d) so that a plurality of projections are measured, and
(f) constructing from said projections an image of the nuclear spin density.

2. A method according to claim 1, wherein for the purpose of simultaneous excitation of a plurality of fast adiabatic passages, simultaneously a plurality of frequencies are beamed-in which are subjected to varying modulation frequencies for the purpose of distinguishing the different local ranges.

* * * * *